US006995632B2

(12) United States Patent
Saito et al.

(10) Patent No.: US 6,995,632 B2
(45) Date of Patent: Feb. 7, 2006

(54) BAND PASS FILTER FOR GHZ-BAND

(75) Inventors: Akihiko Saito, Nagoya (JP); Hiroshi Harada, Yokosuka (JP)

(73) Assignees: Daido Steel Co., Ltd., Nagoya (JP); National Institute of Information Communications and Technology Incorporated, Administrative Agency, Tokyo (JP)

( * ) Notice: Subject to any disclaimer, the term of this patent is extended or adjusted under 35 U.S.C. 154(b) by 10 days.

(21) Appl. No.: 10/756,398

(22) Filed: Jan. 14, 2004

(65) Prior Publication Data

US 2004/0145433 A1 Jul. 29, 2004

(30) Foreign Application Priority Data

Jan. 16, 2003 (JP) ............................. 2003-008811
Dec. 26, 2003 (JP) ............................. 2003-434475

(51) Int. Cl.
*H03H 7/01* (2006.01)

(52) U.S. Cl. ....................................... 333/175; 333/185

(58) Field of Classification Search ................ 333/174, 333/175, 185, 204

See application file for complete search history.

(56) References Cited

U.S. PATENT DOCUMENTS

| | | | | |
|---|---|---|---|---|
| 4,800,343 | A * | 1/1989 | Kinoshita | 333/204 |
| 4,881,050 | A * | 11/1989 | Swanson, Jr. | 333/185 |
| 6,211,754 | B1 * | 4/2001 | Nishida et al. | 333/219 |
| 6,650,203 | B2 * | 11/2003 | Gerstenberg et al. | 333/185 |

* cited by examiner

*Primary Examiner*—Seungsook Ham
(74) *Attorney, Agent, or Firm*—Westerman, Hattori, Daniels & Adrian, LLP

(57) ABSTRACT

Disclosed is a high-frequency band pass filter of simple structure for use in a frequency range from hundreds of MHz to over ten GHz. The band pass filter comprises a magnetic loss sheet 1 prepared by dispersing fine powder of averaged particle size up to 30 μm of a soft magnetic metal such as an Fe—Cr—Al alloy, an input signal line 2 and an output signal line 3 made of a conductive strip disposed in serial direction with a gap between them, a capacitance means connecting the opposite ends of the lines and a GND line 4 disposed on the reverse side of the sheet. The capacitance means may be either a chip condenser 5, or that formed by disposing an internal line 7 of another conductive strip with intermediation of insulating film 6 to bridge on the input signal line 2 and the output signal line 3 to have overlapping parts.

9 Claims, 6 Drawing Sheets

BAND PASS FILTER FOR GHZ-BAND

BACKGROUND OF THE INVENTION

1. Field in the Industry

The present invention concerns a band pass filter for GHz-band used in the frequency range from hundreds of MHz to over ten GHz.

2. Prior Art

Nowadays, for familiar wireless communication devices radio waves of frequency range from hundreds of MHz to over ten GHz are preferably used. Examples are: 800 MHz (0.8 GHz) band or 1.5 GHz band for portable telephone (cellular phone), 1.9 GHz band for PHS, 5.8 GHz band for ETC (electronic toll collection system), 2.4 GHz band or 5.2 GHz band for wireless PAN, and 5.8 GHz band for DSRC (dedicated short range communication).

Because all the radio waves in these frequency ranges are used or possibly used in connection with driving or operating automobiles, it has been intended to utilize them all together by receiving with one antenna and by digital processing. In such cases or even in cases where the radio waves in each frequency ranges are used separately, a band pass filter which passes signals of a certain band width and cuts the other signals is required so that the data may be processed under elimination of noises caused by higher harmonics and reflected waves.

One of the assignees has developed and is providing various electromagnetic wave shielding materials which are made by dispersing soft magnetic powder in a matrix of a rubbery or plastic material. One of the inventors has invented and disclosed a low-pass (high-cut) filter using this electromagnetic wave-absorbing material (Japanese Patent Disclosure No. 2002-171104). The filter is of chip-type having a structure in which one signal line and at least one GND line of a conductive material run in parallel position in close contact on one surface or both the opposite surfaces of a rectangular sheet of a dielectric substance, and characterized in that an electromagnetic wave-absorbing material made by dispersing soft magnetic powder in a synthetic resin matrix is used as the dielectric substance. The product of the working example in the above disclosure has an insertion loss of −5 dB for high frequency waves higher than 1 GHz.

SUMMARY OF THE INVENTION

The basic object of the present invention is to provide, utilizing the above noted knowledge on the low-pass filter disclosed by one of the inventors, a band pass filter for GHz-band used in a frequency range from hundreds of MHz to over ten GHz with a sharp low-cut and high-cut characteristics. The additional object of the invention is to provide a notched band-pass filter for GHz-band having at least one notch in the pass band.

The band pass filter for GHz-band according to the present invention achieving the basic object is principally a high-frequency band pass filter having the structure in which an input signal line and an output signal line made of conductive material strips are disposed in serial direction with a gap on a magnetic loss sheet made by dispersing soft magnetic metal powder in a polymer matrix, the opposite ends of both the signal lines are connected with a capacitance means, and a GND line is disposed on the reverse side of the sheet. The band pass filter is characterize in that the low-cut characteristics are determined by choosing electrostatic capacity of the capacitance means, the high-cut characteristics are determined by the magnetic loss of the magnetic loss sheet, and the low-cut characteristics and the high-cut characteristics are combined to determine the pass bands.

DETAILED EXPLANATION OF PREFERRED EMBODIMENTS OF THE INVENYION

Figure 1:
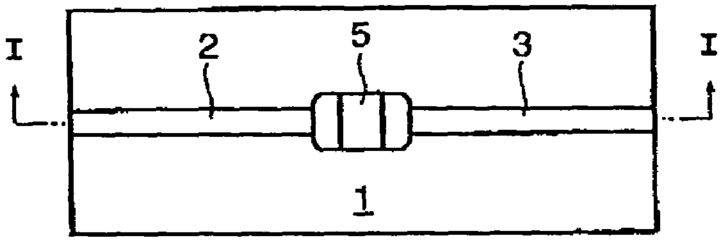
FIG. 1 is a plan view illustrating an embodiment of the band pass filter for GHz-band according to the present invention.
Figure 2:
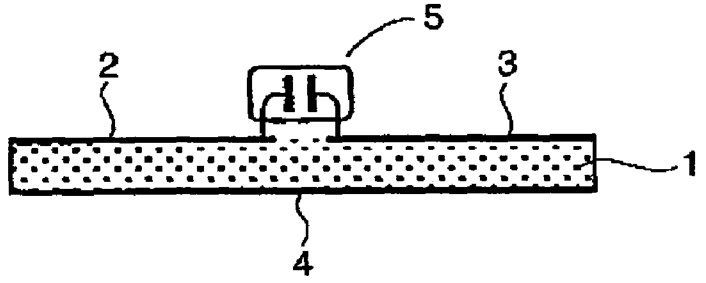
FIG. 2 is a longitudinal cross-section in I—I of the band pass filter shown in FIG. 1.

The first embodiment of the band pass filter for GHz-band according to the present invention is, as shown in FIG. 1 and FIG. 2, a high-frequency band pass filter having the structure in which input signal line 2 and output signal line 3 both made of conductive material strips are disposed in serial direction with a gap on a surface of a magnetic loss sheet 1 made by dispersing soft magnetic metal powder in a polymer matrix, the opposite ends of both the signal lines are connected with a capacitance means, and a GND line 4 is disposed on the reverse surface of the sheet. As th capacitance means a chip condenser 5 is used, and the low-cut characteristics are determined by choosing the electrostatic capacity of the condenser. The high-cut characteristics are determined by choosing impedance given by the lengths, widths, thickness and shapes of input signal line 2 and output signal line 3, and the magnetic loss given by the shapes and filling factor of the soft magnetic metal powder in the matrix, and the shape and thickness of the sheet. The pass band is determined by combination of the low-cut characteristics and the high-cut characteristics.

Figure 3:
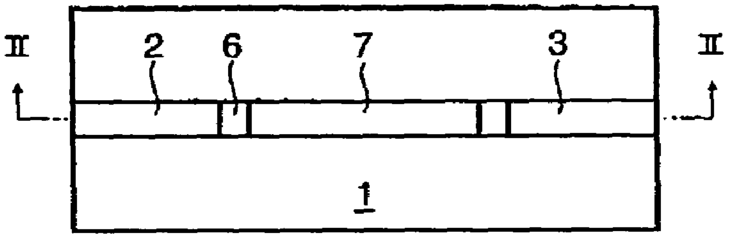
FIG. 3 is a plan view illustrating another embodiment of the band-pass filter for GHz-band according to the present invention.
Figure 4:
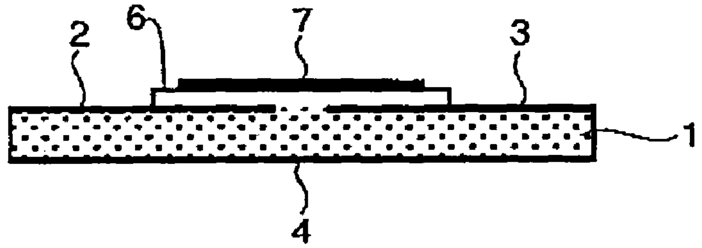
FIG. 4 is a longitudinal cross-section in II—II of the band pass filter for GHz-band shown in FIG. 3.
Figure 5:
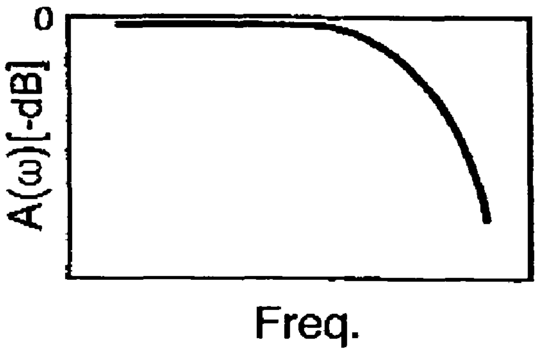
FIG. 5 is a graph showing frequency characteristics of a low-pass filer using a magnetic loss sheet made by dispersing soft magnetic metal powder in a polymer matrix.

The second embodiment of the invention is, as shown in FIG. 3 and FIG. 4, also a high-frequency band pass filter having the structure in which input signal line 2 and output signal line 3 made of conductive material strips are disposed in serial direction with a gap on a surface of a magnetic loss sheet 1 made by dispersing soft magnetic metal powder in a polymer matrix, the opposite ends of both the lines are connected with a capacitance means, and a GND line 4 is disposed on the reverse surface of the sheet. Electrostatic capacitance is formed by disposing an internal line 7 made of another conductive strip on input signal line 2 and output signal line 3 with intermediation of an insulating film 6 in such a manner that the internal line bridges the input signal line and the output signal line, and the low-cut characteristics are determined by the capacitance. The high-cut characteristics are also determined by choosing impedance given by the lengths, widths, thickness and shapes of input signal line 2 and output signal line 3, and the magnetic loss given by the shapes and filling ratio of the soft magnetic metal powder in the matrix, and the shape and thickness of the sheet. The pass band is also determined by combination of the low-cut characteristics and the high-cut characteristics.

In the embodiment of the band pass filter for GHz-band of the invention shown in FIG. 3 and FIG. 4 the electrostatic capacitance may be controlled by choosing the length of overlapping pert of input signal line 2 and internal line 7, and the length of overlapping part of output signal line 3 and internal line 7. Needless to say, capacitance of a condenser is determined by the area and the distance between the overlapping parts. In FIG. 3, the overlapping parts have the same width, and therefore, the area is determined by the length of overlapping.

The distance between the internal line and the input-output signal lines is given by the thickness of the insulating film 6. On the premise that the thickness is given, what determines the electrostatic capacity is the area of the overlapping parts. Also, it will be readily understood that, in case where the input-output signal lines and the internal line made of conductive strips have the same width, the area of the overlapping parts is determined only by the length of the overlapping. At the same area of overlapping parts it is a matter of course that the electrostatic capacity is determined by the dielectric constant and the thickness of th insulating material, and thus, it will be also evident that the band pass characteristics can be altered by controlling the thickness of the insulating material.

In this embodiment the area of the two overlapping parts may be either substantially the same so that the electrostatic capacities of the two condensers may be the same, or different so that the electrostatic capacities of the two condensers may be different. As seen in the Examples described later, combination of choosing the electromagnetic capacity and the impedance in the input signal line and the output signal line determines the pass band and the notching characteristics.

Figure 8:
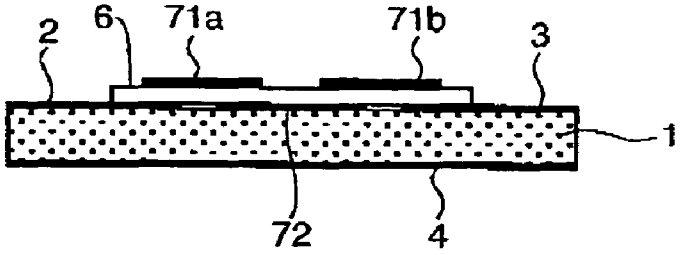
FIG. 8 is a longitudinal cross-section lake FIG. 2 and FIG. 4 illustrating an alternative embodiment of the band pass filter for GHz-band shown in FIG. 3.

The Example of the second embodiment mentioned above and illustrated in FIG. 3 and FIG. 4 has single internal line which bridges on both the input signal line and the output signal line. The internal line itself may be altered into the form of the circuit used in the present invention. More specifically, it is the embodiment in which, as shown in FIG. 8, the internal line is formed with combination of three conductive pieces consisting of one lower conductive line 72 and two upper conductive lines 71*a*, 71*b*, opposing thereto with intermediation of an insulating film 6. As may be understood from this explanation the internal line may be formed with two lower conductive lines and three upper conductive lines. This embodiment is described in Example 4 and FIG. 15.

In the high-frequency band pass filter of the invention, as understood from the above, the low-cut characteristics are given by the capacitance means, and the high-cut characteristics are given by combination of impedance of the input signal line-internal line-output signal line and magnetic loss in the magnetic loss sheet prepared by dispersing soft magnetic metal powder in the synthetic resin matrix. The impedance of the input signal line-internal line-output signal line is determined by the lengths, widths, thickness and shapes of the lines, and the magnetic loss in the magnetic loss sheet is determined mainly by the particle size and filling factor of the soft magnetic metal powder dispersed in the synthetic resin matrix. The band which the band pass filter passes will be synthesis of the high-cut characteristics and the low-cut characteristics, and thus, designing must be done for both the characteristics.

The features of the high-frequency band pass filter of the invention are, as mentioned above, the nothing effect or attenuation of the signal to be passed at a certain frequency or frequencies. The notch frequency of the notch filter at which the attenuation of the signal is maximum may be, also as noted above, controlled by regulating the lengths of the conductive strips mutually overlapping with intermediation by an insulating film.

As the soft magnetic metal powder it is recommended to use powder having an averaged particle size of at largest 30 $\mu$m of a metal selected from the group of Sendust, Fe, Fe—Si alloys, Fe—Ni alloys, Fe—Co alloys, Fe—Cr alloys, Fe—Cr—Al alloys and Fe—Cr—Si alloys. Powder of an averaged particle size larger than 30 $\mu$m is not preferable, because the resulting sheets will not have high magnetic permeability, and is disadvantageous to use. The above-mentioned metal powder may be produced by atomizing a molten metal followed by classification, which may be carried out when necessary.

In regard to the synthetic resins used as the matrix of the magnetic loss sheet one selected from the following group is suitable: nylon, polyphenylene sulfide, epoxy resins and LCP's (liquid crystal polymer). Further thermoplastic or thermosetting resins of a wide range, which can be processed by injection molding or extrusion molding, may be used. Examples are: polyethylene, polypropylene and phenol resins. Processing to sheet form is advantageously carried out by injection molding a mixture of the soft magnetic metal powder and the synthetic resin to form a sheet of a certain size.

As an alternative it is possible to disperse the soft magnetic metal powder into a thermosetting liquid polymer and thereafter, to let the polymer liquid set to the sheet.

As noted above, the characteristics of the magnetic loss sheet, which is important for the high-cut characteristics of the high-frequency band pass filter of the invention, is determined by the permeability and the dielectric constant of the magnetic loss sheet, and what influences these constants are the particle size and filling factor of the soft magnetic metal powder, and thickness of the sheet. Generally speaking, at the same filling percentage a smaller particle size will cut the waves of higher frequency, and at the same particle size a higher filling factor will cut the waves of lower frequency.

The filling factor of the soft magnetic metal powder in the magnetic loss sheet is also a factor of determining thickness of the sheet. The thinner the sheet is, the higher the frequency to be cut is. Another factor is flatness of the soft magnetic metal powder. Too flat powder is not suitable to be used in a higher frequency range.

It has been found that impedance of the input signal line-internal line-output signal line influences the high-cut frequency, particularly, the lengths of the lines give significant influence. The shorter the lines are, the higher the frequency to be cut is. In practicing the present invention it is necessary to take the above mentioned factors into account at designing the band pass filter for GHz-band of the invention.

It is difficult to express the high-cut characteristics by formulating each factors, and therefore, the characteristics are determined on the basis of experience. However, those who skilled in the art may control the high-cut characteristics of the high-frequency band pass filter as desired by referring to the working examples of this invention described later and, if necessary, by carrying out some additional experiments. Anyway, the low-pass filter utilizing the magnetic loss sheet containing the soft magnetic metal powder exhibits the frequency characteristics as seen in Example 5.

Formation of the input-output signal lines of the high-frequency band pass filter of the invention may be carried out by various techniques such as etching (patterning) of flexible substrate, pattern printing of a conductive ink, electroplating or spattering a metal. Formation of the internal lines may be carried out by the same way. Of course there is no problem in carrying out the formation of the input-output signal lines and formation of the internal lines by different ways. Thickness of the signal lines must be determined by taking the resistance allowable in the circuits and the liability of the circuits into account. For easiness in manufacturing such a thick foil as tens of $\mu$m may be sometimes used, however, from the viewpoint of performance thickness of some $\mu$m will be sufficient. Therefore, at the stage of mass production of the same standard, a method of producing which is suitable for the mass production may be chosen, and the thickness which is advantageous for the method of production may be determined.

Figure 6:
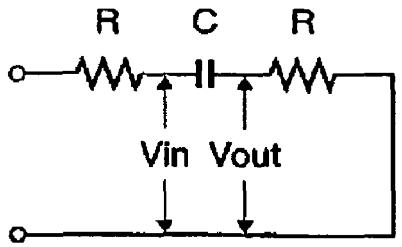
FIG. 6 shows an equivalent circuit of a high-pass filter using a condenser.
Figure 7:
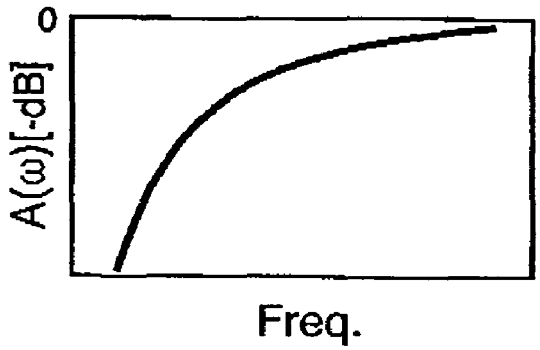
FIG. 7 is a graph showing the frequency characteristics of attenuation of signal given by the circuit of FIG. 6.

The condenser of the band pas filter for GHz-band mentioned in Example 1 and FIG. 2 is a chip-type, laminated ceramic condenser. Such condensers of various levels of capacity and voltage proof are available in the market and may be chosen. The low-cut characteristics of the circuit including condensers may be formularized more easily than the high-cut characteristics. Now, FIG. 6 is considered as an equivalent circuit of the low-cutting component. The formula of attenuation, A(ω), will be expressed by formula 1, which corresponds to a curve shown in FIG. 7.

$$A(\omega)=V_{out}/V_{in}=R/\{(1/j\omega C)+R\}=j\omega RC/(1+j\omega RC) \qquad \text{[Formula 1]}$$

To obtain an attenuation of −3 dB i.e., $20\times\log_{10}\{A(\omega)\}=-3$ dB, $A(\omega)=\sqrt{1/2}$)

and from the above formula, the following is obtained.

$$\omega RC=2\pi f_o RC=1$$

If $f_o$=1 GHz (1000 MHz) and R=50Ω, then C≈3 pF

In the band pass filters of the embodiment shown in FIG. 3 and FIG. 4, i.e., those having the internal line, the characteristics are determined by, as described above, the length of overlapping of input signal line 2 and internal line 7, and the length of overlapping of internal line 7 and the output signal line 3, and further, the filters exhibit notching effect of increas d attenuation at a certain frequency or frequencies. The inventors investigated the influence of the length of overlapping "L" [mm] on the notch frequency "f" [GHz] and derived an experimental, relational expression. Considering the working examples and with necessary experiments a band pass filter for GHz-band having a desired frequency characteristics can be realized.

The band pass filter for GHz-band of the present invention has such a simple structure as that a sheet made by dispersing soft magnetic metal powder in a synthetic resin matrix is used as the base sheet and the input signal line-internal line-output signal line are disposed on one surface of the sheet, and a GND line is disposed on the reverse surface. The band pass filter has the band pass characteristics of passing the signal of desired band in a frequency range from hundreds MHz to over ten GHz but cutting the other high frequency signals.

In the first embodiment of the invention, in one hand, as the capacitance means, a suitable ready-made condenser can be chosen from those available in market and used. This enables mass production of the band pass filter for GHz-band of the invention with ease and with very low cost.

On the other hand, in case of the second embodiment of the invention is employed in regard to the capacitance means, the internal line bridging on the input- and output signal lines is used instead of the condenser, and by choosing the manner of overlapping, the notch effect of attenuating at a particular frequency or frequencies can be obtained in addition to the band pass performance. So far, band pass filters of wide band and notch filters have been constructed by combining various low-pass circuits and high-pass circuits in multiple steps, or the purpose has been achieved by such means as blunting pulse signals. The invention realized desired notch filters with simple circuits.

Thus, the band pass filter for GHz-band of the invention may contribute to unification of the above-mentioned communication devices for automobiles inclusive of the portable telephones, car-navigation system and ETC, and further, it is expected that the present filter may be a useful device in various fields such as UWB transmission.

EXAMPLES

Example 1

Fe-powder of averaged particle size 1.6 $\mu$m was used as the soft magnetic metal powder, and a liquid polymer was selected as the matrix material. The materials were mixed in such a manner that the powder filling factor is 10% by volume, and kneaded, and extruded from a die to form a magnetic loss sheet 1 of 1 mm thick. On the reverse surface a rolled copper foil (35 $\mu$m thick) was adhered to form a lining which is used as the GND line 4, and the sheet was cut int a narrow card of width 20 mm×length 50 mm. On the top surface two ribbons made of the same rolled copper foil of width 2.0 mm×length 24 mm were disposed and adhered in the location from both the ends in the direction toward the center to form the input signal line 2 and the output signal line 3. Bridging on the center gap between the opposite ends of the signal line a chip condenser 5 (chip-type laminated ceramics, made by Matsushita Electric Appliances Co., Ltd.) was disposed by adhering with a conductive adhesive to form a band-pass filter for GHz-band of the structure shown in FIG. 1.

Figure 9:
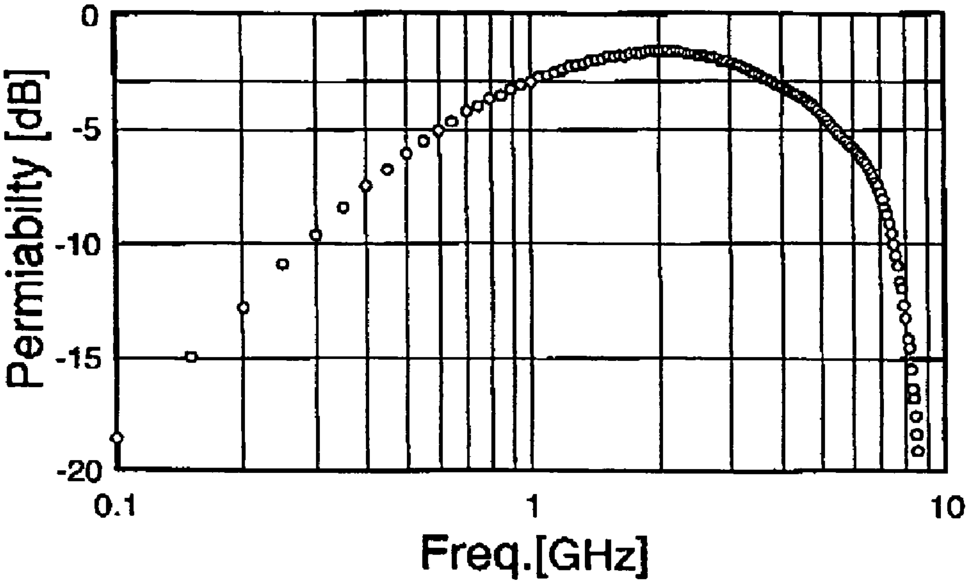
FIG. 9 is a graph showing frequency characteristics of transmission coefficient measured on the high-frequency band-pass filter manufactured in Example 1 of the invention.

Insertion loss in the frequency range from 0.1 GHz (100 MHz) to 10 GHz was measured on this high-frequency band pass filter using a "Network Analyzers" (made by Japan HP) and the graph of FIG. 9 was plotted. According to the graph the high-frequency band pass filter gives attenuation of at least −3 dB to the signals up to 1 GHz and higher than 3.3 GHz. This is a band pass filter useful for the purpose of passing the band of about 1 to 3 GHz.

Example 2

The sheet with copper foil lining or GND line 4 of width 20 mm×length 50 mm prepared in Example 1 was fixed on a phosphor bronze plate of 5 mm thick by adhering for stabilization. At the center of the sheet in the longitudinal direction a base plate made by etching a flexible substrate (copper foil of 35 $\mu$m thick on a polyimide film of 25 $\mu$m thick, the insulating film) was adhered, and two copper ribbons of 35 $\mu$m thick×1.5 mm wide were disposed with 1.0 mm gap between both the ends thereof to form the input signal line 2 and the output signal line 3. On the signal lines a double adhering tape, which was prepared by applying adhesive on both the surfaces of a polyimide tape of 25 $\mu$m thick, was fixed to form the insulating film 6, and an internal line 7 of a copper foil of width 1.5 mm was adhered. Thus, a band pass filter for GHz-band of the structure shown in FIG. 3 and FIG. 4 was manufactured.

The internal line 7 was so disposed that it is over the above-mentioned 1 mm gap bridging on the signal lines and has the overlapping parts of equal length on both the sides, in other words, the electrostatic capacity between the input signal line and the internal line and the electrostatic capacity between the internal line and the output line are the same. The length of the overlapping part in one side was varied from 12.5 mm to 45 mm with intervals of 2.5 mm.

Figure 10:
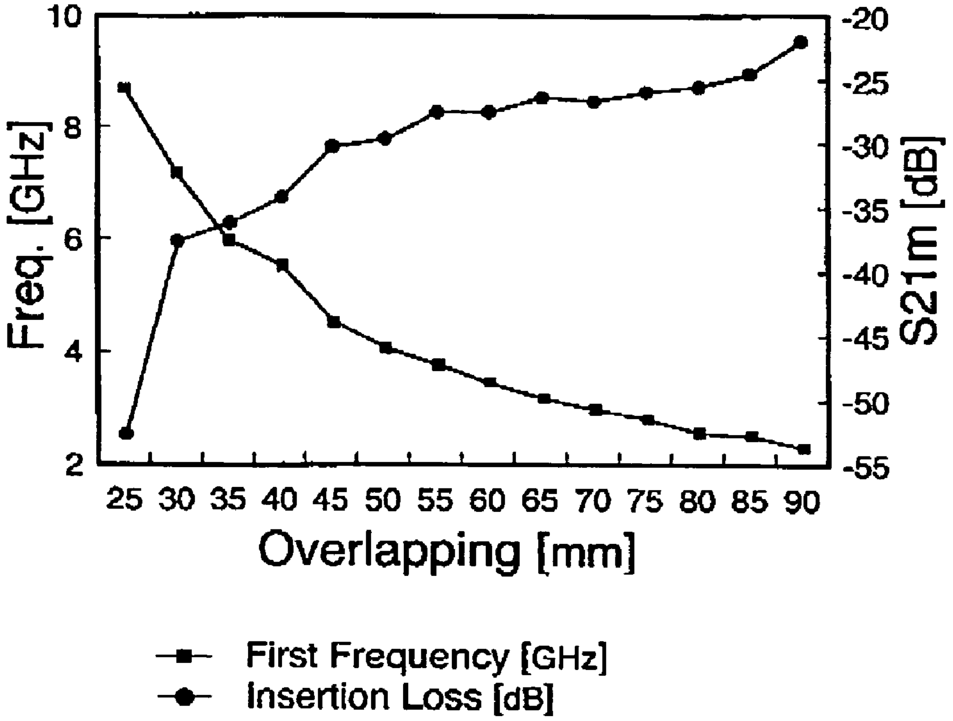
FIG. 10 is a graph showing the relation between the first frequency and the insertion loss based on the data obtained from the high-frequency band pass filter manufactured in Example 2 of the invention.
Figure 11:
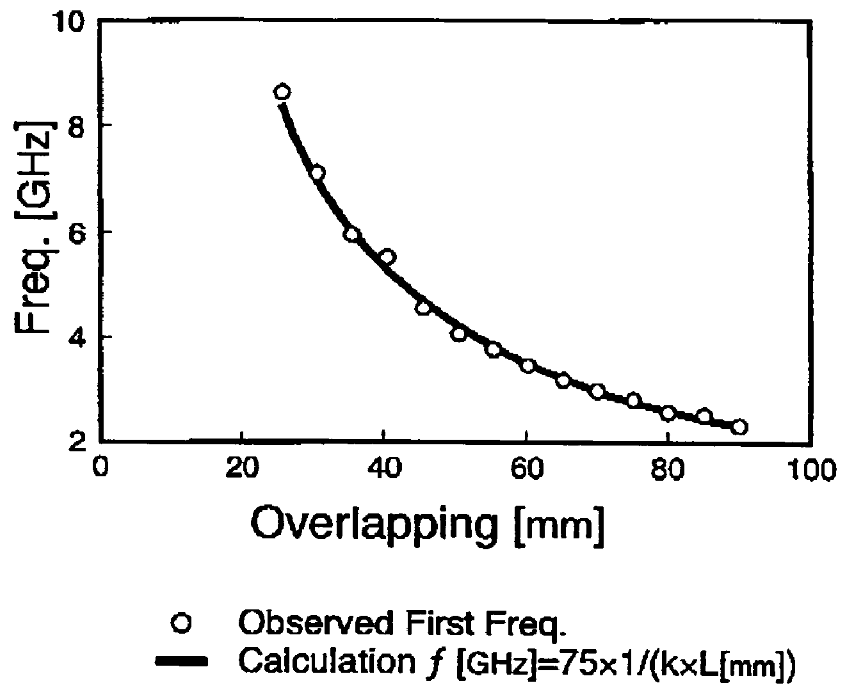
FIG. 11 is a graph from which the relation between the overlapping of lines and the first frequency is drawn.

The band pass filters for GHz-band manufactured above were subjected to measurement of the insertion loss, S21 [db], in the frequency range from 0.1 to 10 GHz. In the resulting graphs, the frequency and the insertion loss at the first position counting from the lower side of frequency range at which the transmission coefficient goes down (hereinafter referred to as "First Frequency") were recorded. By plotting the relation between the above values and the lengths of the overlapping in one-side the graph of FIG. 10 was obtained. Total length of overlapping in the lines is twice of the length of overlapping in one side, and plotting the relation between the line overlapping length and the first frequencies gave the graph of FIG. 11. From this graph the following formula 2 was obtained as the formula of relation between the notch frequency "f" [GHz] and the length of overlapping "L" [mm]:

$$f[GHz]=75\times 1/(k\times L[\text{mm}]) \qquad \text{[Formula 2]}$$

wherein "k" is a constant determined by the metal powder filling factor, the particle size and material. More precisely, a constant determined by complex specific permeability and complex specific dielectric constant. In this Example, k=0.354.

Figure 12:
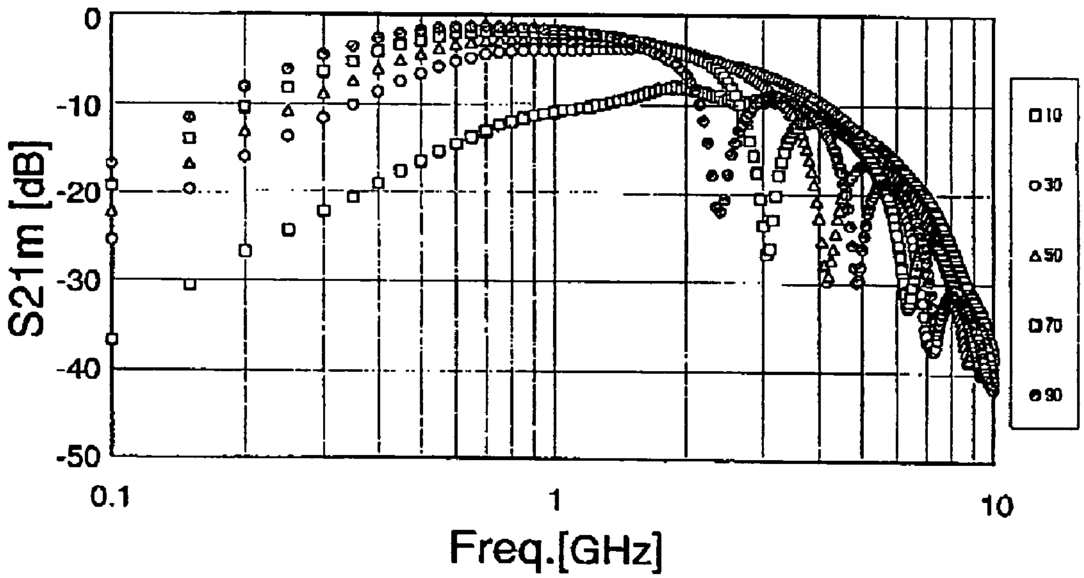
FIG. 12 is a graph showing frequency characteristics of the insertion loss measured on the high-frequency band-pass filter manufactured in Example 2 of the invention.

Frequency characteristics of the transmission coefficient of the band pass filters having overlapping lengths of 10 mm, 30 mm, 50 mm, 70 mm and 90 mm manufactured above were drawn to a graph of FIG. 12. The notch effect of remarkable attenuation was observed at the frequencies depending on the overlapping lengths as shown in Table 1.

Example 3

The length of overlapping of the internal line 7 and the input signal line 2 of the filter manufactured in Example 2 was fixed to 4 mm, and the lengths of overlapping of internal line 7 and the output line 3 were varied from 15 mm to 85 mm with the interval of 5 mm.

Figure 13:
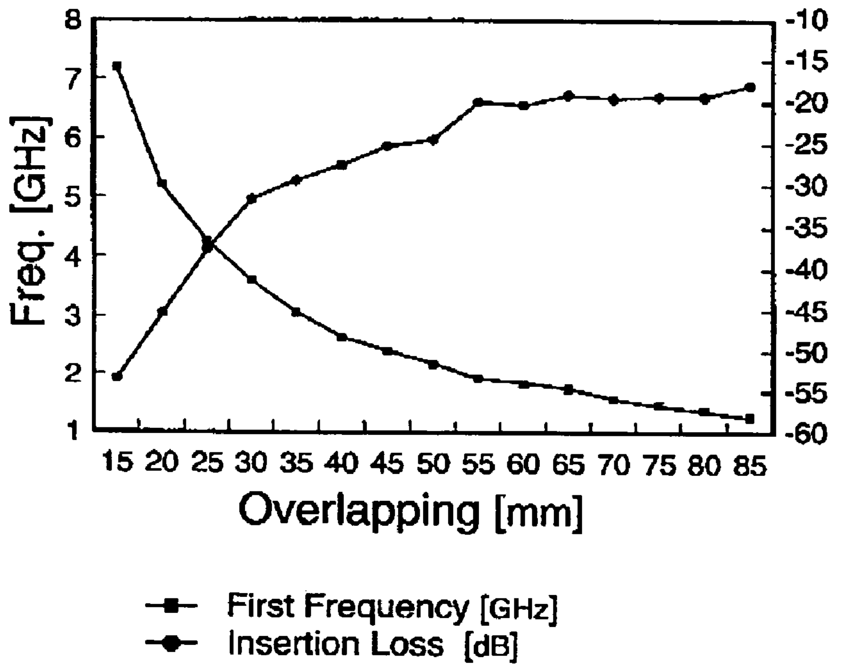
FIG. 13 is a graph like FIG. 10 showing the relation between the first frequency and the insertion loss based on the data obtained from the high-frequency band pass filter manufactured in Example 3 of the invention.
Figure 14:
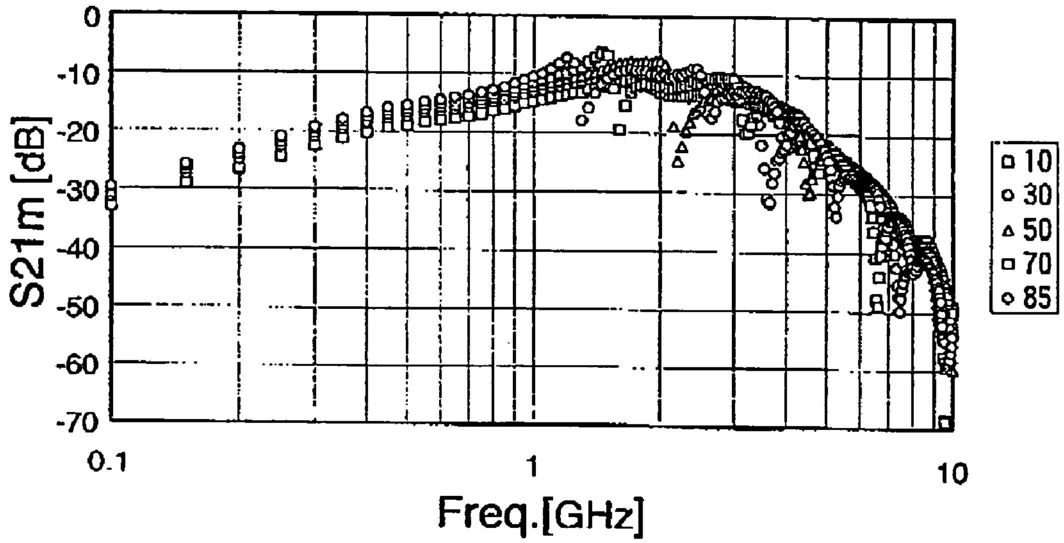
FIG. 14 is a graph like FIG. 12 showing frequency characteristics of the insertion loss measure on the high-frequency band pass filter manufactured in Example 3 of the invention.

Here, the manufactured band pass filters for GHz-band were subjected to measurement of transmission coefficient, S21(dB), in the frequency range from 0.1 to 10 GHz. By plotting the relation between the first frequencies and the transmission coefficients of the resulting graph, the graph of FIG. 13 was obtained. The frequency characteristics of the manufactured band pass filters having the overlapping lengths of 10 mm, 30 mm, 50 mm, 70 mm or 85 mm were plotted to the graph of FIG. 14, which showed the notch effect of attenuation at the frequencies in Table 2.

Example 4

Figure 15:
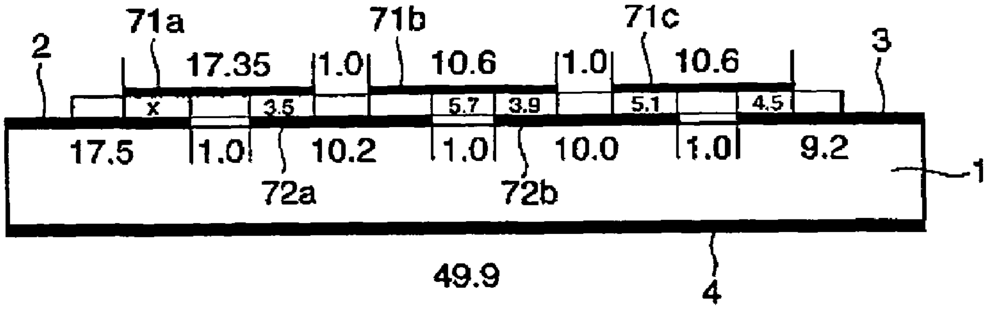
FIG. 15 is a conceptional drawing showing the overlapping lengths of the input signal line, the output signal line and the internal line of the high-frequency band pass filter manufacture in Example 4 of the invention.

By etching the flexible substrate used in Example 2 four copper ribbons of thickness 35 $\mu$m, width 1.0 mm and lengths as shown in FIG. 15 were formed with the gaps as also shown in FIG. 15. The outmost two copper ribbons are the input signal line 2 and the output signal line 3, respectively, and the remaining two ribbons are the lower internal lines. Also by etching the same flexible substrate three copper ribbons of the same thickness and width as those of the above ribbons, and the lengths as shown in FIG. 15 were prepared with the gaps as also shown in FIG. 15. These three copper ribbons are the upper internal lines.

In a manner similar to that of Example 2, the copper foil-lined sheet (width 20 mm, length 50 mm, GND line disposed) prepared in Example 1 was fixed by adhesion on a phosphor bronze of 5 mm thick to form the base sheet. The above etched sheet having four copper ribbons was fixed at the center of the base sheet in the longitudinal direction, and then, a double adhering tape, which was prepared by applying adhesive on both the, surfaces of a polyimide tape of 25 $\mu$m thick, was fixed as the insulating film 6. Then, the above-mentioned etched sheet having three copper ribbons was fixed thereon. Lengths of the overlapping part "X", or the lengths of the overlapping of the input signal line 2 and the leftmost upper internal line 71 of the internal lines, were so varied to be 12.45 mm, 12.85 mm or 13.25 mm.

As done in Examples 1 to 3 transmission coefficient, S21[dB], of thus manufactured band pass filters for GHz-band was measured in the range of 0.1 to 10 GHz. The relation between the values of "X"[mm] and the frequencies [GHz] at which the notch effect is observed is as shown in Table 3.

Figure 16:
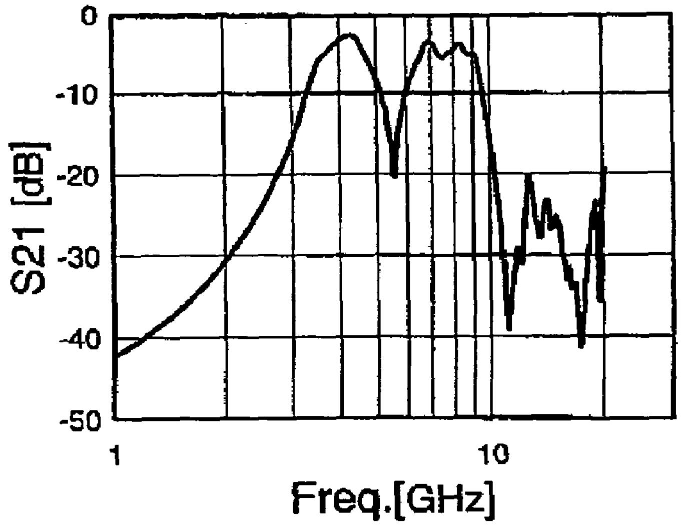
FIG. 16 is a graph like FIG. 9, FIG. 12 and FIG. 14 showing frequency characteristics of the insertion loss measure on the high-frequency band pass filter manufactured in Example 4 of the invention.
Figure 17:
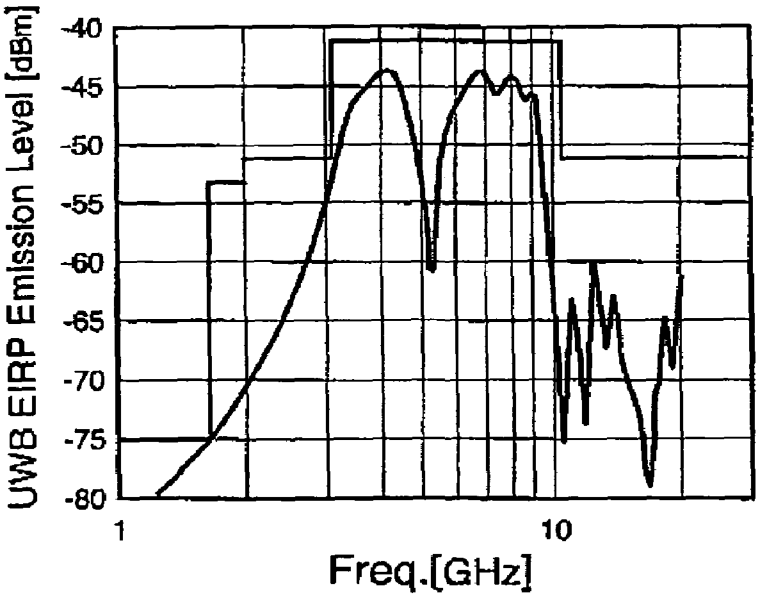
FIG. 17 is a graph made by superposing the graph of FIG. 16 and the UWE (Ultra Wide Band) EIRP (Equivalent Isotropically Radiated Power) emission level standard.

The frequency characteristics of S21 of the case where X=12.45 mm is shown in the graph of FIG. 16. This band pass filter may be called as "band pass filter for 3–10 GHz with a notch at 5 GHz". Superposing this graph on the graph of UWB (ultra wide band) EIRP (equivalent isotropically radiated power) emission level gave FIG. 17. From this graph it is understood that the band pass filter for GHz-band of Example 4 makes it possible to clear the above regulation.

TABLE 1

| Overlapping Length Of Internal Line | Frequency at which Notch Effect is observed |
|---|---|
| 10 mm | — |
| 30 | 7.2 GHz |
| 50 | 4.2 8.6 |
| 70 | 3.0 6.4 |
| 90 | 2.3 4.8 |

TABLE 2

| Overlapping Length Of One Side | Frequency at which Notch Effect is observed |
|---|---|
| 10 mm | — |
| 30 | 3.8 7.5 GHz |
| 50 | 2.2 4.6 |
| 70 | 1.6 3.3 4.8 6.7 |
| 85 | 1.3 2.7 4.0 |

TABLE 3

| Length of the Part "X" | Frequency at which Notch Effect is observed |
|---|---|
| 12.45 mm | 5.6 GHz |
| 12.85 | 5.4 |
| 13.25 | 5.2 |

What is claimed is:

1. A high-frequency band pass filter for GHz band, which comprises an input signal line and an output signal line both made of conductive material strips disposed in serial direction with a gap on a surface of a magnetic loss sheet made by dispersing soft magnetic metal powder in a polymer matrix, a capacitance means connecting both the opposite ends of the signal lines, and a ground line disposed on the reverse surface of the sheet, characterized in that the low-cut characteristics are determined by choosing the electrostatic capacity of the capacitance means, that the high-cut characteristics are determined by choosing impedance of the input line and the output line, and the magnetic loss of the magnetic loss sheet, and that the passing band is determined by combination of the low-cut characteristics and the high-cut characteristics.

2. A high-frequency band pass filter for GHz-band, which comprises an input signal line and an output signal line both made of conductive material strips disposed in serial direction with a gap on a surface of a magnetic loss sheet made by dispersing soft magnetic metal powder in a polymer matrix, a capacitance means connecting both the opposite ends of the signal lines, and a ground line disposed on the reverse surface of the sheet, characterized in that a chip condenser is used as the capacitance means, that the low-cut characteristics are determined by choosing the electrostatic capacity of the condenser, that the high-cut characteristics are determined by choosing impedance given by the length, width, thickness and shapes of the input line and the output line, and the magnetic loss given by the shapes and filling factor of the soft magnetic metal powder in the matrix, and the shape and thickness of the sheet, and that the low-cut characteristics and the high-cut characteristics are combined to determine the passing band.

3. A high-frequency band pass filter for GHz-band, which comprises an input signal line and an output signal line both made of conductive material strips disposed in serial direction with a gap on a surface of a magnetic loss sheet made by dispersing soft magnetic metal powder in a polymer matrix, a capacitance means connecting both the opposite ends of the signal lines and a ground line disposed on the reverse surface of the sheet, characterized in that electrostatic capacity is formed by disposing an internal line made of another conductive strip on the input signal line and the output signal line with intermediation of an insulating film in such a manner that the internal line bridges the input signal line and the output signal line, that the low-cut characteristics are determined by the capacitance, and the high-cut characteristics are determined by choosing impedance given by the length, width, thickness and shapes of the input signal line and the output signal line, and the magnetic loss given by the shapes and filling ratio of the soft magnetic metal powder in the matrix, and the shape and thickness of the sheet, and that the passing band is determined by combining the low-cut characteristics and the high-cut characteristics.

4. A band pass filter for GHz-band according to claim 3, characterized in that an area of overlapping part of input signal line and the internal line, and the area of overlapping part of output signal line and the internal line are chosen respectively to control the electrostatic capacitance formed by respective capacitance means thereby to determine the band pass characteristics and/or notching characteristics.

5. A band pass filter for GHz-band according to claim 4, characterized in that the widths of the signal lines and the internal line are identical, that the lengths of the overlapping part of input signal line and the internal line, and the lengths of the overlapping part of output signal line and the internal line are chosen respectively to control the electrostatic capacitance formed by the respective capacitance means, thereby to determine the band pass characteristics and notching characteristics.

6. A band pass filter for GHz-band according to one of claims 1 to 3, characterized in that, as the soft magnetic metal powder, powder having an averaged particle size of at largest 30 μm of a metal selected from the group consisting of Sendust, Fe, Fe—Si alloys, Fe—Ni alloys, Fe—Co alloys, Fe—Cr alloys, Fe—Cr—Al alloys and Fe—Cr—Si alloys is used.

7. A band pass filter for GHz-band according to one of claims 1 to 3, characterized in that the magnetic loss sheet 1 is formed by using as the synthetic resin for the matrix one selected from the group consisting of nylon, polyphenylene sulfide, epoxy resins and liquid crystal polymers and that the mixture of the soft magnetic metal powder and the synthetic resin is injection-molded into a sheet of a certain size.

8. A band pass filter for GHz-band according to one of claims 1 to 3, characterized in that the magnetic loss sheet 1 is prepared by dispersing the soft magnetic metal powder into a thermosetting liquid polymer and letting the polymer liquid set to the sheet.

9. A band pass filter for GHz-band according to claim 1 or 3, characterized in that the signal lines and the internal line are formed by etching a flexible substrate, pattern printing of conductive ink, or plating or spattering a metal.

* * * * *

UNITED STATES PATENT AND TRADEMARK OFFICE

CERTIFICATE OF CORRECTION

PATENT NO. : 6,995,632 B2
APPLICATION NO. : 10/756398
DATED : February 7, 2006
INVENTOR(S) : Akihiko Saito et al.

It is certified that error appears in the above-identified patent and that said Letters Patent is hereby corrected as shown below:

On the Front Page, Item (73): Assignees

Please correct the Second Assignee's Name which should read,

--National Institute of Information and Communications Technology Incorporated, Administrative Agency--.

Signed and Sealed this

Sixth Day of March, 2007

JON W. DUDAS
*Director of the United States Patent and Trademark Office*